(12) United States Patent
Yun et al.

(10) Patent No.: US 9,257,579 B2
(45) Date of Patent: Feb. 9, 2016

(54) ELECTRONIC DEVICES AND METHOD OF FABRICATING THE SAME

(71) Applicant: Electronics and Telecommunications Research Institute, Daejeon (KR)

(72) Inventors: Sun Jin Yun, Daejeon (KR); Chang Bong Yeon, Gyeonggi-do (KR); Yoo Jeong Lee, Seoul (KR); JungWook Lim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 178 days.

(21) Appl. No.: 13/952,904

(22) Filed: Jul. 29, 2013

(65) Prior Publication Data
US 2014/0026963 A1    Jan. 30, 2014

(30) Foreign Application Priority Data

Jul. 30, 2012  (KR) .................. 10-2012-0083394
May 10, 2013  (KR) .................. 10-2013-0053136

(51) Int. Cl.
| | | |
|---|---|---|
| *H01L 31/056* | (2014.01) | |
| *H01L 31/0232* | (2014.01) | |
| *H01L 31/18* | (2006.01) | |
| *H01L 31/0224* | (2006.01) | |
| *H01L 31/0236* | (2006.01) | |
| *H01L 51/52* | (2006.01) | |
| *H01L 33/40* | (2010.01) | |
| *H01L 21/00* | (2006.01) | |

(52) U.S. Cl.
CPC .... *H01L 31/02327* (2013.01); *H01L 31/02366* (2013.01); *H01L 31/022425* (2013.01); *H01L 31/056* (2014.02); *H01L 31/1884* (2013.01); *H01L 33/405* (2013.01); *H01L 51/5209* (2013.01); *H01L 2933/0016* (2013.01); *Y02E 10/52* (2013.01)

(58) Field of Classification Search
None
See application file for complete search history.

(56) References Cited

U.S. PATENT DOCUMENTS

| | | | | |
|---|---|---|---|---|
| 4,554,727 A | * | 11/1985 | Deckman et al. | 438/71 |
| 4,633,030 A | * | 12/1986 | Cook | 136/246 |
| 5,094,697 A | * | 3/1992 | Takabayashi et al. | 136/249 |
| 5,101,260 A | * | 3/1992 | Nath et al. | 257/53 |

(Continued)

FOREIGN PATENT DOCUMENTS

| | | |
|---|---|---|
| KR | 10-2008-0079891 A | 9/2008 |
| KR | 10-2009-0084539 A | 8/2009 |

OTHER PUBLICATIONS

Jun-Sik Cho, et al., "Enhancement of light trapping by textured back electrodes in tandem micromorph n-i-p silicon thin film solar cells", Current Applied Physics, vol. 11, pp. S2-S7, Jan. 2011.

*Primary Examiner* — Evren Seven
(74) *Attorney, Agent, or Firm* — Rabin & Berdo, P.C.

(57) ABSTRACT

Provided is a method of fabricating an electronic device. The method according to the present inventive concept may include forming a lower electrode having a flat portion and protrusions on a substrate, forming an intermediate layer on the lower electrode, and forming an upper electrode on the intermediate layer. The forming of the lower electrode may include forming a conductive film by depositing a first metal on the substrate, and depositing a second metal on the conductive film to prepare an alloy of the first metal and the second metal.

9 Claims, 4 Drawing Sheets

(56) References Cited

U.S. PATENT DOCUMENTS

| | | | |
|---|---|---|---|
| 5,282,902 A * | 2/1994 | Matsuyama | 136/249 |
| 5,620,530 A * | 4/1997 | Nakayama | 136/259 |
| 5,711,824 A * | 1/1998 | Shinohara et al. | 136/259 |
| 5,981,934 A * | 11/1999 | Higashikawa | 250/214 R |
| 6,123,824 A * | 9/2000 | Sano et al. | 205/124 |
| 6,331,672 B1 * | 12/2001 | Matsuda et al. | 136/256 |
| 6,534,336 B1 * | 3/2003 | Iwane et al. | 438/71 |
| 6,563,041 B2 * | 5/2003 | Sugawara et al. | 136/250 |
| 6,613,603 B1 * | 9/2003 | Sano | 438/72 |
| 6,951,689 B1 * | 10/2005 | Higashikawa | 428/699 |
| 7,301,215 B2 * | 11/2007 | Kariya | 257/458 |
| 7,875,945 B2 * | 1/2011 | Krasnov et al. | 257/436 |
| 7,968,361 B2 * | 6/2011 | Osawa et al. | 438/47 |
| 8,816,191 B2 * | 8/2014 | Dutta | 136/256 |
| 8,895,844 B2 * | 11/2014 | Ding et al. | 136/256 |
| 8,896,077 B2 * | 11/2014 | Cui et al. | 257/432 |
| 2002/0157703 A1 * | 10/2002 | Nakayama et al. | 136/256 |
| 2005/0000564 A1 * | 1/2005 | Sato et al. | 136/256 |
| 2008/0029152 A1 * | 2/2008 | Milshtein et al. | 136/252 |
| 2010/0024862 A1 * | 2/2010 | Tawada | 136/244 |
| 2011/0048531 A1 * | 3/2011 | Lee et al. | 136/256 |
| 2011/0180127 A1 * | 7/2011 | Wan et al. | 136/252 |
| 2012/0091488 A1 * | 4/2012 | Vermersch et al. | 257/98 |
| 2013/0187192 A1 * | 7/2013 | Hoeppel | 257/99 |

\* cited by examiner

ELECTRONIC DEVICES AND METHOD OF FABRICATING THE SAME

CROSS-REFERENCE TO RELATED APPLICATIONS

This U.S. non-provisional patent application claims priority under 35 U.S.C. §119 of Korean Patent Application Nos. 10-2012-0083394, filed on Jul. 30, 2012, and 10-2013-0053136, filed on May 10, 2013, the entire contents of which are hereby incorporated by reference.

BACKGROUND

The present invention disclosed herein relates to electronic devices, and more particularly, to electrodes for an electronic device having protrusions.

The amount of fossil fuel energy, such as petroleum, coal, and natural gas, commonly used today is limited and the use of fossil fuels emits pollutants. Therefore, development of alternative energy sources capable of replacing the fossil fuel energy is very important. One of the techniques receiving most attention is a photo-conversion device utilizing photoelectric effect, such as a solar cell. An electric power generation technique using sunlight generates power by converting photo-energy into electrical energy. The photo-conversion device converts unlimitedly available energy of sunlight into electrical energy. The photo-conversion device is environmentally friendly, because solar cells cause no pollution, such as air pollution, noise, heat, or vibration. Since the transportation of fuel and the maintenance of power generation facility are not required for the photo-conversion device, the photo-conversion device may have semi-permanent lifespan. Therefore, an improvement of the efficiency of the photo-conversion device has been the main direction for the development of solar cells.

SUMMARY

The present invention provides a solar cell having an improved light absorption ratio.

The present invention provides a light-conversion device which may increase conversion efficiency of light into electricity by effectively utilizing the light.

The present invention also provides a light-emitting device having improved luminous efficiency.

The present invention also provides a display and a light-emitting device which may increase luminous efficiency, i.e., the conversion efficiency of electricity into light, by generating and effectively emitting the light.

The object of the present invention is not limited to the aforesaid, but other objects not described herein will be clearly understood by those skilled in the art from descriptions below.

Embodiments of the present invention provide methods of fabricating an electronic device including: forming a lower electrode having a flat portion and protrusions on a substrate; forming at least one intermediate layer on the lower electrode; and forming an upper electrode on the at least one intermediate layer, wherein the forming of the lower electrode may include: forming a conductive film by depositing a first metal on the substrate; and depositing a second metal on the conductive film to prepare an alloy of the first metal and the second metal, and the flat portion and the protrusions may include the alloy of the first metal and the second metal.

In some embodiments, the protrusions may have a content ratio of the second metal higher than that of the flat portion.

In other embodiments, the first metal may include copper, and the second metal may include silver.

In still other embodiments, the flat portion may have the same compositional ratio as that of the protrusions.

In even other embodiments, the first metal may include aluminum, and the second metal may include silver.

In yet other embodiments, the deposition of the second metal may be performed at a temperature ranging from about 270° C. to about 400° C.

In further embodiments, the lower electrode may be formed between the conductive film and the at least one intermediate layer.

In still further embodiments, the lower electrode may be formed to be in contact with the substrate.

In even further embodiments, the protrusions may extend from the flat portion.

In other embodiments of the present invention, electronic devices include: a substrate; a lower electrode disposed on the substrate and having a flat portion and protrusions; an intermediate layer on the lower electrode; and an upper electrode on the intermediate layer, wherein the lower electrode may include an alloy of a first metal and a second metal, and the protrusions may have a content ratio of the second metal higher than that of the flat portion.

In some embodiments, the electronic device may further include a conductive film disposed between the substrate and the lower electrode, wherein the conductive film may include the first metal.

In other embodiments, the first metal may include copper, and the second metal may include silver.

In still other embodiments, the at least one intermediate layer may include at least one of silicon (Si), silicon germanium (SiGe), silicon carbide (SiC), silicon oxide (SiO), silicon nitride (SiN), silicon oxynitride (SiON), silicon carbonitride (SiCN), silicon germanium oxide (SiGeO), silicon germanium oxynitride (SiGeON), silicon germanium carbide (SiGeC), a chalcopyrite-based compound semiconductor, and a Group II-IV compound semiconductor.

In still other embodiments, the at least one intermediate layer comprises a light absorbing layer generating electrical power from light.

In even other embodiments, the at least one intermediate layer may include an organic light-emitting material.

In yet other embodiments, the at least one intermediate layer may include an inorganic light-emitting material.

In still other embodiments of the present invention, electronic devices include: a substrate; a conductive film disposed on the substrate and including a first metal; a lower electrode disposed on the substrate and including the first metal and a second metal; an intermediate layer on the lower electrode; and an upper electrode on the intermediate layer, wherein the lower electrode may include a flat portion on the conductive film and protrusions extending from the flat portion.

In some embodiments, the protrusions may have a content ratio of the second metal higher than that of the flat portion.

In other embodiments, the protrusions may have the same content ratio of the second metal as that of the flat portion.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF THE EMBODIMENTS

Preferred embodiments of the present invention will be described below in more detail with reference to the accompanying drawings in order to fully understand the constitution and effect of the present invention. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Those skilled in the art will understand that the present inventive concept can be implemented in an appropriate environment.

In the following description, the technical terms are used only for explaining a specific exemplary embodiment while not limiting the present invention. The terms of a singular form may include plural forms unless referred to the contrary. The meaning of "comprises" and/or "comprising" specifies a property, a region, a fixed number, a step, a process, an element and/or a component but does not exclude other properties, regions, fixed numbers, steps, processes, elements and/or components.

In addition, it will be understood that when an element such as a layer, film, region, or substrate is referred to as being "on" another element, it can be directly on the other element or intervening elements may also be present.

Also, though terms like a first, a second, and a third are used to describe various regions and layers in various embodiments of the present invention, the regions and the layers are not limited to these terms. These terms are used only to distinguish one region or layer from another region or layer. Therefore, a layer referred to as a first layer in one embodiment can be referred to as a second layer in another embodiment. An embodiment described and exemplified herein includes a complementary embodiment thereof. Like reference numerals refer to like elements throughout.

Unless otherwise defined, all terms used herein have the same meaning as commonly understood by one of ordinary skill in the art to which this inventive concept belongs.

Hereinafter, an electronic device according to the present invention will be described with reference to the accompanying drawings.

Figure 1:
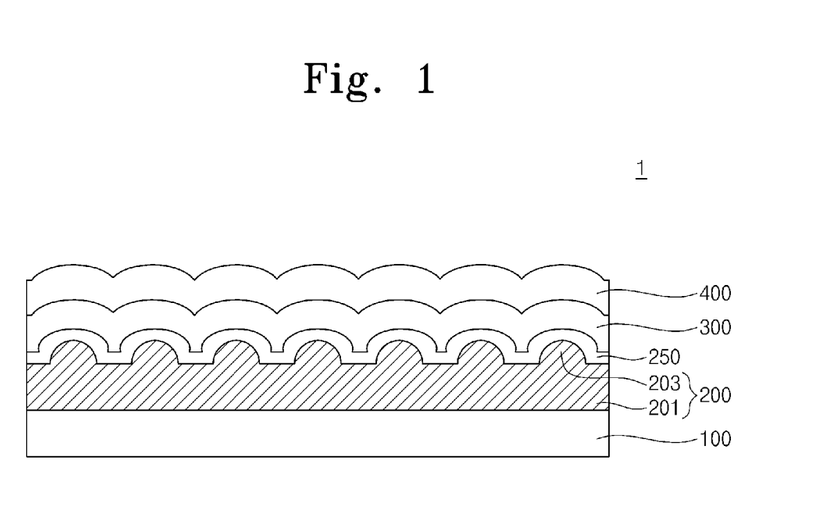
FIG. 1 is a cross-sectional view illustrating an electronic device according to an embodiment of the present invention.

FIG. 1 is a cross-sectional view illustrating an electronic device according to an embodiment of the present invention.

Referring to FIG. 1, an electronic device 1 may include a lower electrode 200, an intermediate layer 300, and an upper layer 400, which are sequentially stacked on a substrate 100. The electronic device 1 may be a display device, such as an organic light-emitting device or an inorganic electroluminescent device, or a solar cell. The electronic device 1 may further include a back reflection layer 250.

The substrate 100 may be opaque. The substrate 100 may include stainless steel, plastic, metal, or a polymer.

The lower electrode 200 may be opaque. The lower electrode 200 may be rough. For example, a top surface of the lower electrode 200 may have a root mean square (rms) roughness ranging from about 30 nm to about 500 nm. The lower electrode 200 may have a flat portion 201 and protrusions 203. The protrusions 203 may extend from the flat portion 201 and may have a shape of an island. Hereinafter, the protrusions may be indicated to have an rms roughness of about 30 nm or more. Since the lower electrode 200 has protrusions 203, diffuse reflectance of light at an interface between the lower electrode 200 and the intermediate layer 300 or an interface between the lower electrode 200 and the back reflection layer 250 may be increased. With respect to a solar cell, when the diffuse reflectance increases, the distance traveled by the light passing through a light absorbing layer increases, and thus, a light absorption ratio may increase. With respect to a light-emitting device, when the diffuse reflectance increases, in which the outcoupling of emitted light from the device may increase. Thus, luminous efficiency may increase. The lower electrode 200 may include an alloy of a first metal and a second metal. The first metal may include copper (Cu) or aluminum (Al), and the second metal may include silver (Ag). For example, when the first metal includes Cu, a content ratio of the second metal in the protrusions 203 may be higher than that in the flat portion 201. As another example, when the first metal includes Al, the content ratio of the second metal in the protrusions 203 may be the same or similar to that in the flat portion 201. The lower electrode 200 may have a thickness ranging from about 50 nm to about 400 nm. The content of the second metal (e.g., Ag) of the lower electrode 200 may be decreased, but the lower electrode 200 may have identical or similar conductivity in comparison to the case in which the first metal is omitted.

The back reflection layer 250 may be disposed between the lower electrode 200 and the intermediate layer 300. The back reflection layer 250 may include transparent conductive oxide, e.g., zinc oxide or impurity-doped zinc oxide. In the case that the lower electrode 200 includes copper, the back reflection layer 250 may prevent the degradation of the performance of the intermediate layer 300 caused by the diffusion of copper into the intermediate layer 300. As another example, the back reflection layer 250 may be omitted.

The intermediate layer 300 may have a curved section by extending along the protrusions 203. According to an embodiment of the present invention, the intermediate layer 300 may function as a light absorbing layer by including a semiconductor material. The intermediate layer comprises a photo-conversion material. In this case, the electronic device 1 may function as a solar cell by converting the incident sunlight to electrical energy. For example, the intermediate layer 300 may include at least one of silicon (Si), silicon germanium (SiGe), silicon carbide (SiC), silicon oxide (SiO), silicon nitride (SiN), silicon oxynitride (SiON), silicon carbonitride (SiCN), silicon germanium oxide (SiGeO), silicon germanium oxynitride (SiGeON), and silicon germanium carbide (SiGeC). The intermediate layer 300 may include a single layer or multilayers. The intermediate layer 300 may have a PIN diode structure. For example, the intermediate layer 300 may include a p-type silicon layer, an intrinsic silicon layer, and an n-type silicon layer, which are sequentially stacked. As another example, the intermediate layer 300 may include an n-type silicon layer, an intrinsic silicon layer, and a p-type silicon layer, which are sequentially stacked. Alternatively, the intermediate layer 300 may include a Group I-III-IV chalcopyrite-based compound semiconductor, such as copper indium gallium selenium (CuInGaSe). Alternatively, the intermediate layer 300 may include a Group II-VI compound semiconductor, such as ZnO, ZnS, ZnSe, ZnOS, ZnOSe, and ZnOSSe. As another example, the intermediate layer 300 may include a Group II-IV compound semiconductor, such as cadmium telluride (CdTe).

As another example, the intermediate layer 300 may include an organic light-emitting material. In this case, the electronic device 1 may be an organic light-emitting device. For example, the intermediate layer 300 may include at least any one of a polyfluorene derivative, a (poly)paraphenylenevinylene derivative, a polyphenylene derivative, a polyvinylcarbazole derivative, a polythiophene derivative, an anthracene derivative, a butadiene derivative, a tetracene derivative, a distyrylarylene derivative, a benzazole derivative, and/or carbazole. The intermediate layer 300 may further include a dopant in the organic light-emitting material.

According to an embodiment of the present invention, the intermediate layer 300 may include an organic photoelectric material.

As another example, the intermediate layer 300 may include an inorganic light-emitting material.

According to an embodiment of the present invention, the intermediate layer 300 may be composed of a light absorbing layer, an n-type semiconductor, and a p-type semiconductor. The light absorbing layer may generate carriers by absorbing light. The n-type semiconductor and the p-type semiconductor may function as a diode. According to another embodiment of the present invention, the intermediate layer 300 may be composed of a light-emitting layer, an n-type semiconductor, and a p-type semiconductor. The light-emitting layer may convert electrical energy into light energy. The n-type semiconductor and the p-type semiconductor may function as a diode.

The upper electrode 400 extends along the intermediate layer 300 and may have a curved section. The upper electrode 400 may include a transparent conductive oxide. For example, the upper electrode 400 may include zinc oxide (ZnO) doped with Al, Ga, B, or In, tin oxide ($SnO_2$), or tin oxide doped with fluorine, indium tin oxide (ITO).

Photo-conversion efficiency or luminous efficiency of the intermediate layer 300 of the electronic device 1 of the present invention may be increased in comparison to the case in which the protrusions 203 are omitted.

Figure 2:
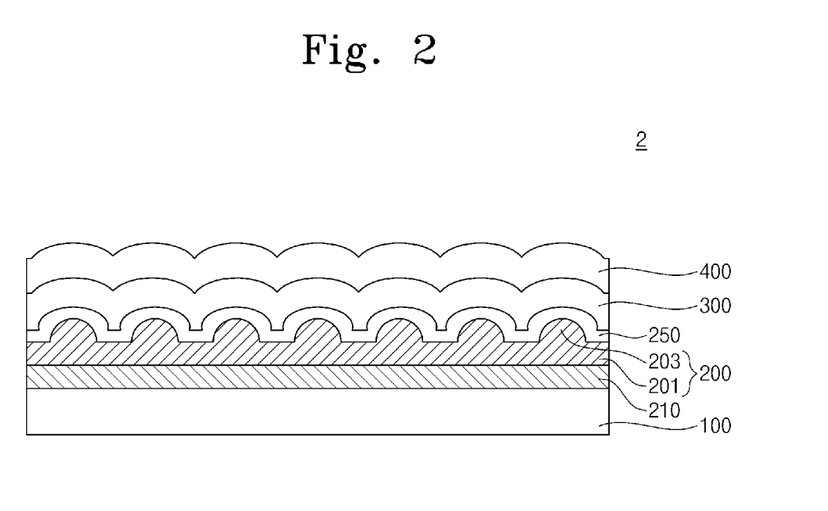
FIG. 2 is a cross-sectional view illustrating an electronic device according to another embodiment of the present invention.

FIG. 2 is a cross-sectional view illustrating an electronic device according to another embodiment of the present invention. Hereinafter, descriptions overlapping with those of FIG. 1 will be omitted.

Referring to FIG. 2, an electronic device 2 may include a conductive film 210, a lower electrode 200, a back reflection layer 250, an intermediate layer 300, and an upper electrode 400, which are sequentially stacked on a substrate 100.

The conductive film 210 may include a first metal, e.g., Cu or Al.

The lower electrode 200 may have a flat portion 201 and protrusions 203. The lower electrode 200 may have an rms roughness ranging from about 30 nm to about 500 nm. The lower electrode 200 may include the first metal and a second metal. The second metal may include Ag. For example, in the case that the first metal includes Cu, a content ratio of the second metal in the protrusions 203 may be higher than that in the flat portion 201. As another example, a content ratio of the first and second metals in the protrusions 203 may be the same or similar to that in the flat portion 201.

A method of fabricating an electronic device according to the present invention will be described with reference to the accompanying drawings. Hereinafter, descriptions overlapping with the aforementioned descriptions will be omitted.

Figure 3:
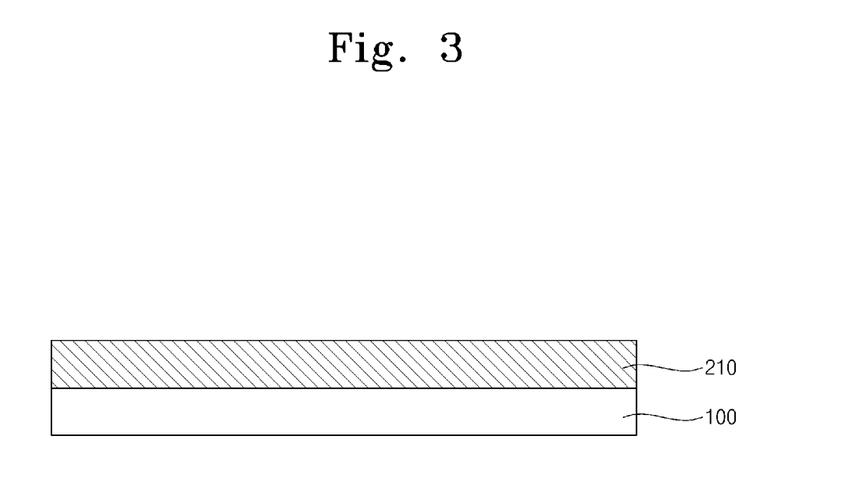
FIGS. 3 through 5 are cross-sectional views illustrating a method of fabricating an electronic device according to an embodiment of the present invention.
Figure 4:
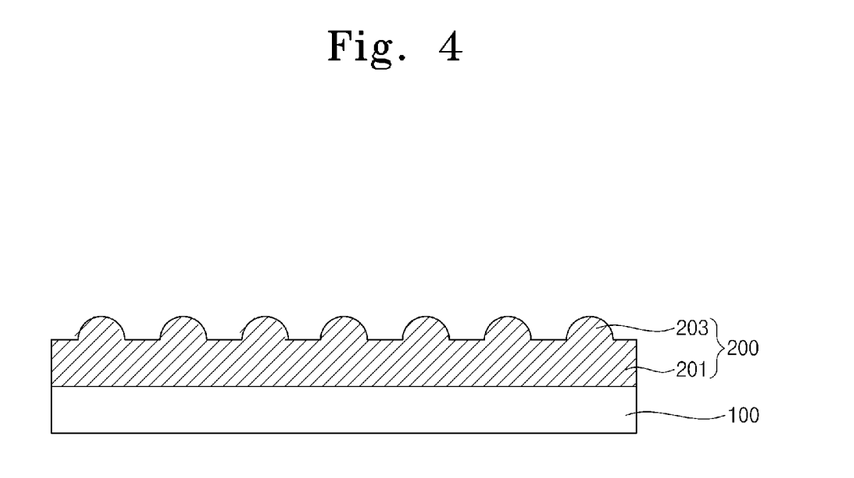
Figure 5:
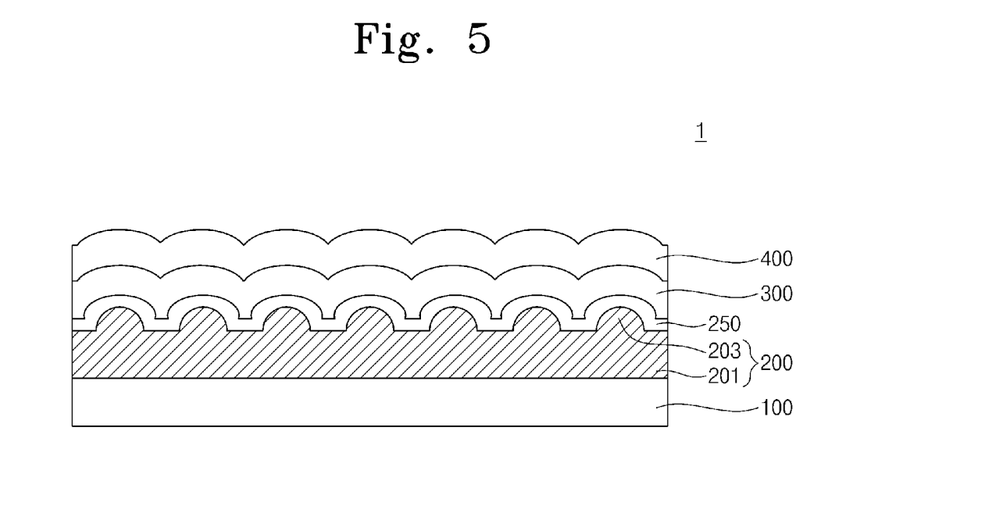

FIGS. 3 through 5 are cross-sectional views illustrating a method of fabricating an electronic device according to an embodiment of the present invention.

Referring to FIG. 3, a conductive film 210 may be formed on a substrate 100. The substrate 100 may be opaque, and may include stainless steel, plastic, metal, or a polymer. The conductive film 210 may be formed by depositing a first metal, e.g., Cu or Al, on the substrate 100. The deposition of the conductive film 210 may be performed by electron beam evaporation, thermal evaporation, sputter deposition, solution-based coating, printing, or chemical vapor deposition. The substrate 100 may not be heated during the deposition of the conductive film 210, and thus, the substrate 100 may not be damaged by heat.

Referring to FIG. 4, a lower electrode 200 including a first metal and a second metal may be formed on the substrate 100. The lower electrode 200 may include a flat portion 201 and protrusions 203. For example, the second metal (e.g., Ag) may be deposited on the conductive film 210 under a temperature condition ranging from about 270° C. to about 400° C. The deposition of the second metal may be performed by thermal evaporation, electron beam evaporation, sputter deposition, or chemical vapor deposition. The second metal may be deposited to have a thickness ranging from about 33.3% to about 10000% of a thickness of the conductive film 210. An alloy may be prepared from the second metal and the conductive film 210 to form the lower electrode 200. The conductive film 210 may promote the formation of the protrusions 203. In the case that the formation of the conductive film 210 is omitted, the protrusions 203 may be formed at a temperature of about 500° C. or more. Since the second metal is deposited on the conductive film 210, the protrusions 203 may be formed at a temperature ranging from about 270° C. to about 400° C. Therefore, the substrate 100 may not be damaged by heat. The lower electrode 200 prepared from the conductive film 200 may be rougher, in comparison to the case in which the formation of the conductive film 210 is omitted. For example, in the case that an alloy is prepared by sequentially depositing the first metal and the second metal, a surface roughness of the lower electrode 200 may be higher, in comparison to the case in which an alloy is prepared by simultaneously depositing the first metal and the second metal.

In the case that Cu is used as the first metal, a content ratio of the second metal in the protrusions 203 may be higher than that in the flat portion 201. In the case in which Al is used as the first metal, since mutual solubility between the first metal and the second metal may be high, a content ratio of the first and second metals in the protrusions 203 may be the same or similar to that in the flat portion 201.

Referring to FIG. 5, a back reflection layer 250, an intermediate layer 300, and an upper electrode 400 may be sequentially formed on the lower electrode 200. The fabrication of the electronic device 1 described as an example of FIG. 1 may be completed, according to the above-described fabrication example.

Figure 6:
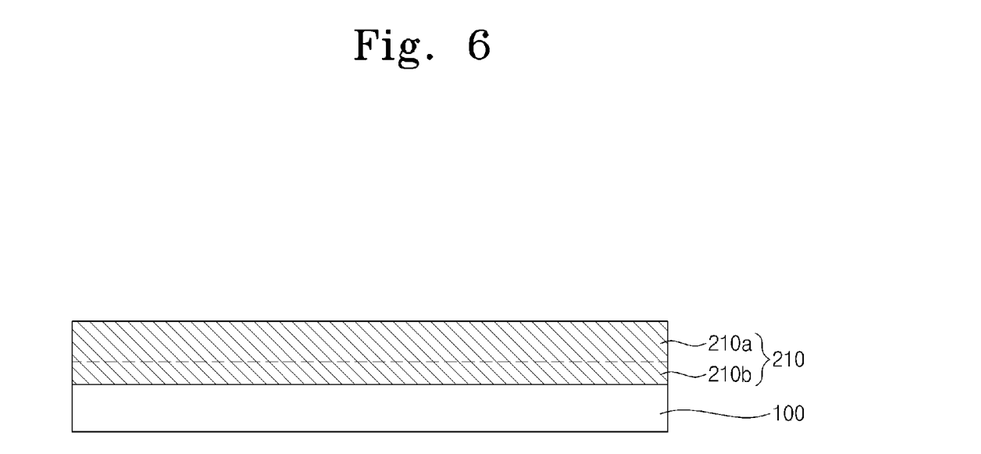
FIGS. 6 and 7 are cross-sectional views illustrating a method of fabricating an electronic device according to another embodiment of the present invention.
Figure 7:
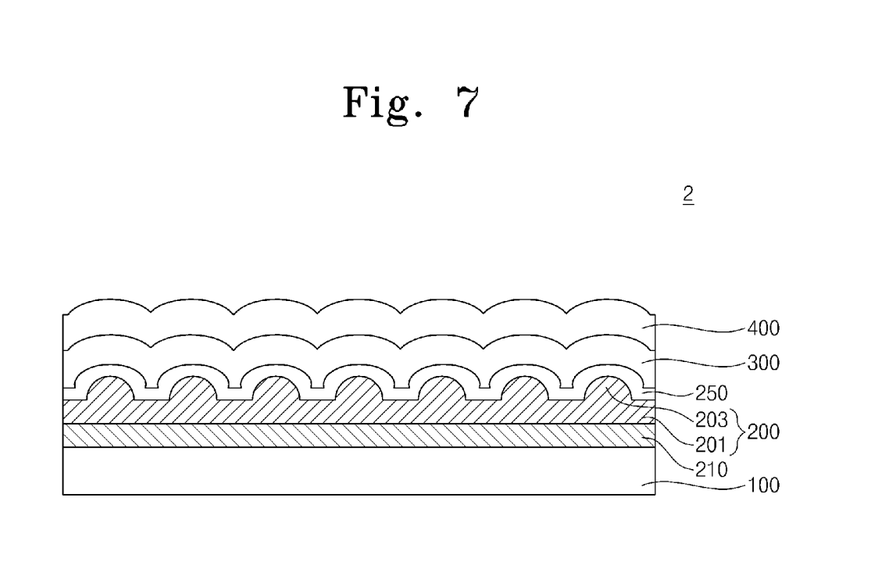

FIGS. 6 and 7 are cross-sectional views illustrating a method of fabricating an electronic device according to another embodiment of the present invention.

Referring to FIG. 6, a substrate 100 including a conductive film 210 may be prepared. The conductive film 210 may be formed by using the same material and method as those described in FIG. 3.

Referring to FIG. 7, a lower electrode 200 may be formed on the conductive film 210 by preparing an alloy of a first metal and a second metal. The conductive film 210 may promote the formation of protrusions 203. For example, the second metal (e.g., Ag) may be deposited on the conductive film 210 under a temperature condition ranging from about 270° C. to about 400° C. The conductive film 210 may have a thickness ranging from about 1% to about 300% of a thickness of the second metal deposited. An upper portion of the conductive film 210 (see 210a in FIG. 6) may be combined with the second metal to form an alloy. A lower portion of the conductive film 210 (see 210b in FIG. 6) may not form an alloy with the second metal, and thus, may be included in the electronic device 2. The substrate 100 may not be damaged by heat during the formation process of the lower electrode 200. A back reflection layer 250, an intermediate layer 300, and an upper electrode 400 may be sequentially formed on the lower electrode 200. The fabrication of the electronic device 2 described as an example of FIG. 2 may be completed, according to the above-described fabrication example.

Hereinafter, the fabrication methods and evaluation results of characteristics of the electronic devices according to the present inventive concept will be described in more detail, according to experimental examples of the present invention.

FABRICATION OF ELECTRONIC DEVICES

COMPARATIVE EXAMPLE 1-1

An about 125 μm thick stainless steel (STS) substrate may be prepared. A silver layer having a thickness of about 200 nm may be deposited on the STS substrate by magnetron sputtering using about 99.99% pure silver as a target. The deposition was performed at a temperature of about 25° C.

COMPARATIVE EXAMPLE 1-2

An electronic device was fabricated in the same manner as Comparative Example 1-1 except that deposition was performed at a temperature of about 400° C.

EXPERIMENTAL EXAMPLE 1-1

An electronic device was fabricated in the same manner as Comparative Example 1-1 except that an aluminum layer having a thickness of about 100 nm was formed on a STS substrate and a silver layer was then deposited on the aluminum layer. The deposition was performed at a temperature of about 270° C.

EXPERIMENTAL EXAMPLE 1-2

An electronic device was fabricated in the same manner as Experimental Example 1-1. Deposition in the present experimental example was performed at a temperature of about 320° C.

EXPERIMENTAL EXAMPLE 1-3

An electronic device was fabricated in the same manner as Experimental Example 1-1 except that deposition in the present experimental example was performed at a temperature of about 350° C.

EXPERIMENTAL EXAMPLE 1-4

An electronic device was fabricated in the same manner as Experimental Example 1-1 except that deposition in the present experimental example was performed at a temperature of about 370° C.

EXPERIMENTAL EXAMPLE 1-5

An electronic device was fabricated in the same manner as Experimental Example 1-1 except that deposition in the present experimental example was performed at a temperature of about 400° C.

EXPERIMENTAL EXAMPLE 2

An electronic device was fabricated in the same manner as Experimental Example 1-5 except that a copper layer, instead of an aluminum layer, was formed on a STS substrate in the present experimental example.

EVALUATION OF CHARACTERISTICS OF ELECTRONIC DEVICES

AUGER ELECTRON SPECTROSCOPY

A flat portion and protrusions of each of Experimental Example 1-5 and Experimental Example 2 were measured by Auger electron spectroscopy (AES).

Table 1 presents results of AES measurements of Experimental Example 1-5.

Referring to Table 1 with FIGS. 1 and 2, it may be confirmed that the protrusions 203 had a content ratio of silver similar to that of the flat portion 201. In Experimental Example 1-5, the first metal was composed of aluminum and the second metal was composed of silver. As a result, mutual solubility between the first metal and the second metal were high, and thus, it may be understood that the content ratio of the second metal in the protrusions 203 may be the same or similar to that in the flat portion 201.

TABLE 1

| | AES | |
| --- | --- | --- |
| | Flat portion (%) | Protrusions (%) |
| Silver (Ag) | 54.9 | 55.3 |
| Aluminum (Al) | 45.1 | 44.7 |

Table 2 presents results of AES measurements of Experimental Example 2.

Referring to Table 2 with FIGS. 1 and 2, it may be confirmed from the results of AES that a surface of the protrusions 203 had a content ratio of silver similar to that of a surface of the flat portion 201. In Experimental Example 2, the first metal was composed of copper and the second metal was composed of silver. As a result, it may be understood that mutual solubility between the first metal and the second metal in Experimental Example 2 was lower than that of Experimental Example 1-5.

TABLE 2

| | AES | |
| --- | --- | --- |
| | Flat portion (%) | Protrusions (%) |
| Silver (Ag) | 95.09 | 96.71 |
| Copper (Cu) | 4.91 | 3.29 |

Figure 8:
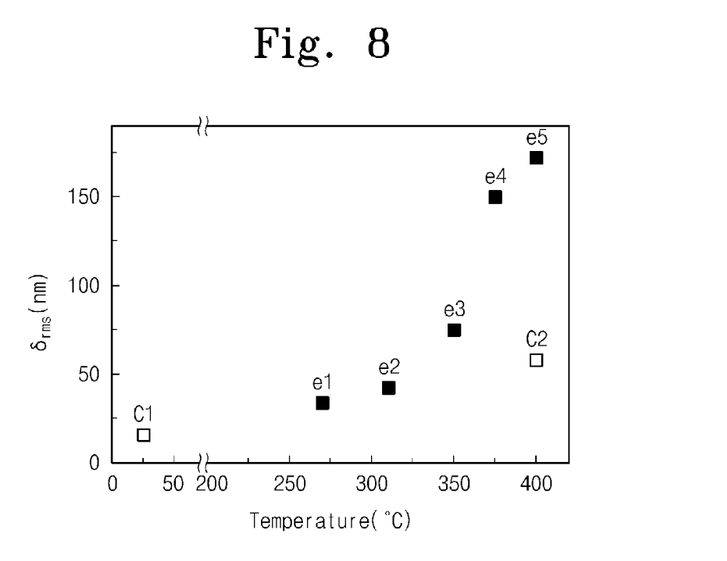
FIG. 8 is a graph illustrating root mean square (rms) roughness values vs. temperature for comparative examples and experimental examples of the present invention.

FIG. 8 is a graph illustrating rms roughness values vs. temperature for the comparative examples and Experimental Examples 1-1 to 1-5 of the present invention. Comparative Examples 1-1 and 1-2 were respectively represented as c1 and c2. Experimental Examples 1-1 and 1-5 were respectively represented as e1 to e5.

Referring to FIG. 8, it may be observed that Experimental Example 1-5 (e5) had an rms roughness higher than that of Comparative Example 1-2 at the same temperature. Therefore, it may be confirmed that higher rms roughness may be obtained in comparison to the case in which the conductive film 210 was omitted, according to the fact that the lower electrode 200 was formed by the deposition of the second metal on the conductive film 210.

A lower electrode having protrusions according to the present inventive concept may cause diffuse reflection of light at an interface between the lower electrode and an intermediate layer to obtain a high light utilization rate in comparison to the case in which a lower electrode is flat with no protrusions. A method of forming a lower electrode according to the present inventive concept may include the formation of a conductive pattern and may promote the formation of the protrusions. The lower electrode may be formed of an alloy of the conductive pattern and a second metal. Since the lower electrode may be prepared at a temperature ranging from about 270° C. to about 400° C., a substrate may not be damaged by heat.

While preferred embodiments of the present invention has been particularly shown and described with reference to the accompanying drawings, it will be understood by those of ordinary skill in the art that various changes in form and details may be made therein without departing from the spirit and scope of the present invention as defined by the following claims.

What is claimed is:

1. A method of fabricating an electronic device, the method comprising:
    forming a lower electrode having a flat portion and protrusions on a substrate;
    forming an intermediate layer on the lower electrode; and
    forming an upper electrode on the intermediate layer,
    wherein the forming of the lower electrode comprises:
        forming a conductive film by depositing a first metal on the substrate; and
        depositing a second metal on the conductive film to prepare an alloy of the first metal and the second metal, and
        the flat portion and the protrusions comprise the alloy of the first metal and the second metal.

2. The method of claim 1, wherein the protrusions have a content ratio of the second metal higher than that of the flat portion.

3. The method of claim 2, wherein the first metal comprises copper, and the second metal comprises silver.

4. The method of claim 1, wherein the flat portion has the same compositional ratio as that of the protrusions.

5. The method of claim 4, wherein the first metal comprises aluminum, and the second metal comprises silver.

6. The method of claim 1, wherein the deposition of the second metal is performed at a temperature ranging from about 270° C. to about 400° C.

7. The method of claim 1, wherein the lower electrode is formed between the conductive film and the intermediate layer.

8. The method of claim 1, wherein the lower electrode is formed to be in contact with the substrate.

9. The method of claim 1, wherein the protrusions extend from the flat portion.

* * * * *